United States Patent
Liu (10) Patent No.: US 10,656,528 B1
(45) Date of Patent: May 19, 2020

(54) LITHOGRAPHIC MASK FUNCTIONS TO MODEL THE INCIDENT ANGLES OF A PARTIALLY COHERENT ILLUMINATION

(71) Applicant: Synopsys, Inc., Mountain View, CA (US)

(72) Inventor: Peng Liu, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/238,444

(22) Filed: Jan. 2, 2019

Related U.S. Application Data (60) Provisional application No. 62/741,693, filed on Oct. 5, 2018.

(51) Int. Cl.
  *G03F 7/20* (2006.01)
  *G03F 1/76* (2012.01)
  *G03F 1/70* (2012.01)

(52) U.S. Cl.
  CPC ............ *G03F 7/70091* (2013.01); *G03F 1/70* (2013.01); *G03F 1/76* (2013.01); *G03F 7/705* (2013.01); *G03F 7/70158* (2013.01)

(58) Field of Classification Search
  CPC ... G03F 7/705; G03F 7/70091; G03F 7/70666
  See application file for complete search history.

(56) References Cited

U.S. PATENT DOCUMENTS

| | | | | |
|---|---|---|---|---|
| 7,921,383 | B1* | 4/2011 | Wei | G03F 7/705 703/13 |
| 2005/0179886 | A1* | 8/2005 | Shi | G03F 1/36 355/77 |
| 2007/0038973 | A1* | 2/2007 | Li | G03F 1/36 716/51 |
| 2009/0287461 | A1* | 11/2009 | Lee | G03F 1/36 703/2 |
| 2010/0141925 | A1* | 6/2010 | Cao | G03F 7/705 355/77 |
| 2010/0191518 | A1* | 7/2010 | Chen | G03F 1/36 703/14 |
| 2016/0349608 | A1* | 12/2016 | Zhang | G03F 7/00 |
| 2017/0147733 | A1* | 5/2017 | Rosenbluth | G03F 1/36 |

* cited by examiner

*Primary Examiner* — Steven Whitesell Gordon
(74) *Attorney, Agent, or Firm* — Fenwick & West LLP (57) ABSTRACT

In the embodiments disclosed herein, an approach based on a mask function $\overline{M}$ is disclosed. This approach meets the requirement of the Hopkins model and at the same time incorporates the incident angle effects of a given partially coherent illumination. The new mask function $\overline{M}$ is referred to as a partially coherent mask function (PCMF). In the embodiments disclosed herein, the incident angle effects of individual source points of a given partially coherent illumination are removed from the mask function $\overline{M}$ and incorporated into a source function G. As a result, use of the partially coherent mask function $\overline{M}$ does not require an integration over individual plane waves in the illumination, as would be the case with a rigorous mask function M. Therefore, the Hopkins model can be used with partially coherent mask function $\overline{M}$ and at the same time capture the incident angle effects.

20 Claims, 5 Drawing Sheets

FIG. 6

LITHOGRAPHIC MASK FUNCTIONS TO MODEL THE INCIDENT ANGLES OF A PARTIALLY COHERENT ILLUMINATION

CROSS-REFERENCE TO RELATED APPLICATION(S)

This application claims priority under 35 U.S.C. § 119(e) to U.S. Provisional Patent Application Ser. No. 62/741,693, "Lithographic Mask Functions to Model the Incident Angles of a Partially Coherent Illumination," filed Oct. 5, 2018. The subject matter of the foregoing is incorporated herein by reference in its entirety.

BACKGROUND

1. Technical Field

This disclosure relates to computational lithography.

2. Description of Related Art

In a lithography process, the lithographic mask is illuminated by a set of plane waves having different incident angles, referred to as partially coherent illumination. In computational lithography applications, the incident radiation angle effects of the mask diffraction are captured in the mask three-dimensional model to accurately predict printed device patterns. Traditionally this is accomplished by using an imaging model that rigorously solves Maxwell's equations. An example of such a rigorous imaging model is the Abbe imaging model in which the total radiation image formed in a photoresist is a sum of individual images, each individual image produced by an incident plane wave from the illumination and computed using the mask diffraction function (or simply mask function) specific to the given incident plane wave.

The mask functions are generally incident angle dependent. This effect typically must be captured in advanced lithography simulations to accurately predict the behavior of printed patterns (e.g., pattern-dependent best focus variations, thru-focus behaviors of critical dimensions and pattern shifts). Although this effect can be rigorously taken into account by the Abbe imaging model, the rigorous imaging model is computationally expensive and therefore not suitable for full-chip applications.

Thus, there is a need for more computationally efficient approaches.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1:
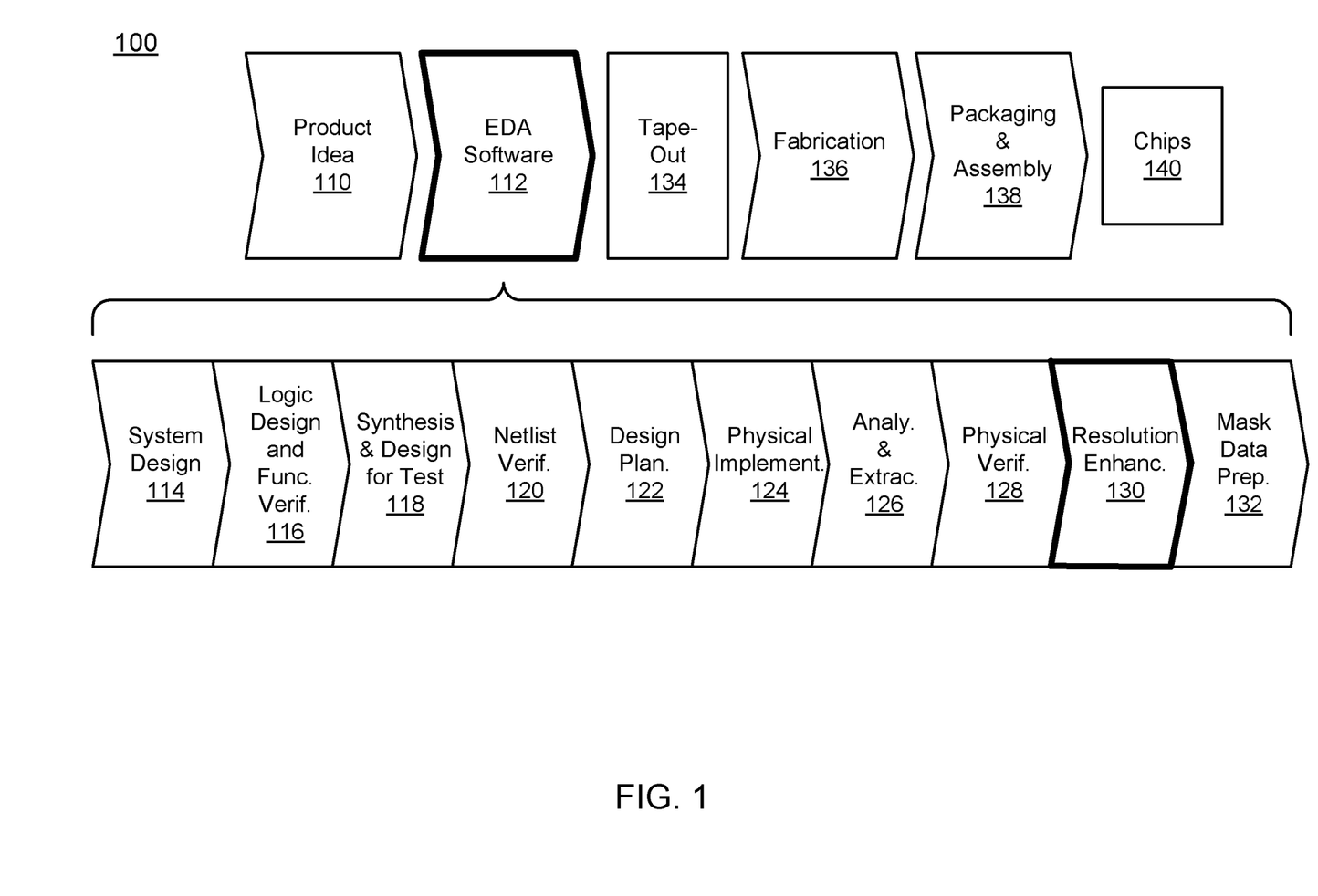
FIG. 1 is a flow diagram illustrating various operations in the design and fabrication of an integrated circuit.

For context, FIG. 1 illustrates various processes performed in the design and fabrication of an integrated circuit using software tools with a computer to transform data and instructions that represent the integrated circuit. These processes start with the generation of a product idea 110 with information supplied by a designer and is realized during a design process that uses EDA software tools 112, which may also be signified herein as EDA software, as a design tool or a verification tool. When the design is finalized, it can be taped-out 134. After tape-out, a semiconductor die is fabricated 136 and packaging and assembly processes 138 are performed, which result in the finished integrated circuit 140 which may also be signified herein as a circuit, device, component, chip or SoC (system on chip).

Note that the design process that uses EDA software tools 112 includes operations 114-132, which are described below. This design flow description is for illustration purposes only and is not meant to limit the present disclosure. For example, an actual integrated circuit design may require a designer to perform the design operations in a different sequence than the sequence described herein.

During system design 114, a designer describes the functionality to be manufactured. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products.

Then, during logic design and functional verification 116, VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: VCS, Vera, Designware, Magellan, Formality, ESP and Leda products.

Next, during synthesis and design for test 118, VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

Moreover, during netlist verification 120, the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

Furthermore, during design planning 122, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

Additionally, during physical implementation 124, the placement positioning of circuit elements such as transistors or capacitors and routing connection of the same by a plurality of conductors occurs. Exemplary EDA software products from Synopsys, Inc. of Mountain View, Calif. that can be used at this stage include: the Astro and IC Compiler products.

Then, during analysis and extraction 126, the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products.

Next, during physical verification 128, the design is checked to ensure correctness for manufacturing issues, electrical issues, lithographic issues, and circuitry. Exemplary EDA software products from Synopsys, Inc. of Mountain View, Calif. that can be used at this stage include the Hercules product.

Moreover, during resolution enhancement 130, geometric manipulations of the layout are performed to improve manufacturability of the design. Exemplary EDA software products from Synopsys, Inc. of Mountain View, Calif. that can be used at this stage include: Proteus, Proteus, and PSMGED products.

Additionally, during mask-data preparation 132, the "tape-out" data for production of masks to produce finished integrated circuits is provided. Exemplary EDA software products from Synopsys, Inc. of Mountain View, Calif. that can be used at this stage include the Cats. family of products.

For all the above mentioned integrated circuit design tools, similar tools from other EDA vendors, such as Cadence and Mentor Graphics, can be used as an alternative. Additionally, similarly non-commercial tools available from universities can be used.

A storage subsystem is preferably used to store the basic programming and data constructs that provide the functionality of some or all the EDA tools described herein, and tools applied for development of cells for the library and for physical and logical design using the library. These software modules are generally executed by one or more processors in a manner known to those of ordinary skill in the art.

Embodiments of the present disclosure can be used during one or more of the above-described stages. Specifically, some embodiments of the present disclosure can be used in EDA software 112 as a part of resolution enhancement 130. Resolution enhancement typically includes computationally lithography, where the effect of different mask layouts on incident illumination is simulated.

Figure 2A:
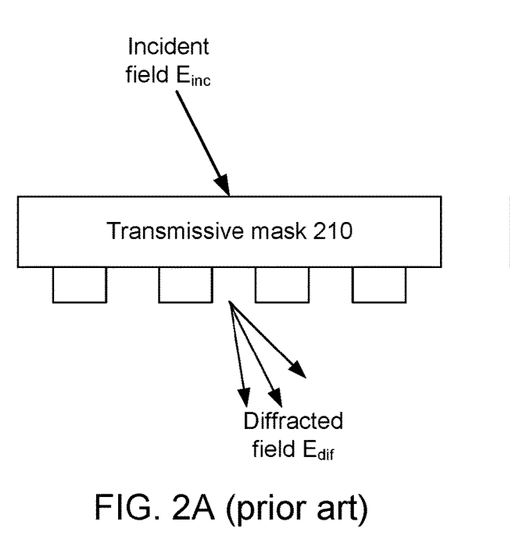
FIGS. 2A and 2B (prior art) illustrate the mask diffraction process of an incident plane wave for masks used in lithography processes.
Figure 2B:
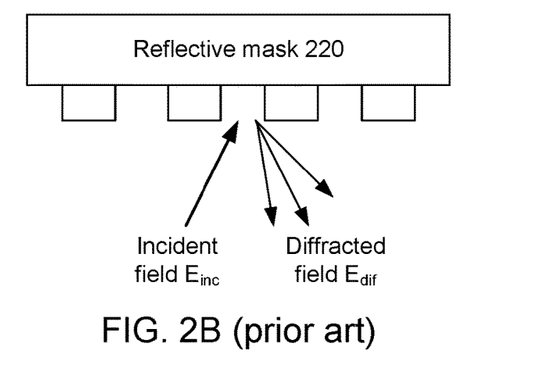

FIGS. 2A and 2B (prior art) illustrate the mask diffraction process of an incident plane wave for masks used in lithography processes. In these figures, $E_{inc}$ is the incident field and $E_{dif}$ is the diffracted field. FIG. 2A shows a transmissive mask 210 and FIG. 2B shows a reflective mask 220. To simulate the printed pattern before the mask is used in actual production processes, simulation and optimization tools may calculate a mask function M in the form of a tensor. The tensor contains elements $M_{\alpha\beta}$, which is defined as the ratio of the diffracted field $E_{dif}$ to the incident field $E_{inc}$, for each of the incident plane waves:

$$M_{\alpha\beta}(\vec{x}, s) = \frac{E_{dif,\alpha}(\vec{x}, s)}{E_{inc,\beta}(\vec{x}, s)}, \quad (1)$$

where $E_{inc}$ is the incident field, $E_{dif}$ is the diffracted field, subscripts $\alpha,\beta$ denote x, y or z components of the field polarization, vector $\vec{x}$ represents spatial coordinates, and 's' is used to signify that the property is specific to the given incident plane wave.

For any given simulation, Maxwell's equations can be solved to obtain M for the given diffraction structure. Although M is a 3-by-3 tensor in general, only four of the nine elements are independent, because only two of the x, y, z field components are independent, typically with x and y components being independent and calculated, and the z component derived from the x and y components due to constraints imposed by Maxwell's equations. Therefore, the following tensor form of M is sufficient to describe the mask diffraction process.

$$\vec{\vec{M}}(\vec{x}, s) = \begin{bmatrix} M_{xx}(\vec{x}, s) & M_{xy}(\vec{x}, s) \\ M_{yx}(\vec{x}, s) & M_{yy}(\vec{x}, s) \end{bmatrix} \quad (2)$$

The mask function M is typically represented in the form of a Fourier expansion in the x-y plane:

$$\vec{\vec{M}}(\vec{x},s) = \Sigma_{\vec{k}} \vec{\vec{M}}(\vec{k},s) e^{i\vec{k}\cdot\vec{x}} \quad (3)$$

$$\vec{\vec{M}}(\vec{k},s) = \int \vec{\vec{M}}(\vec{x},s) e^{-i\vec{k}\cdot\vec{x}} d\vec{x} \quad (4)$$

where M(k,s) is the Fourier transform of M(x,s) and $\vec{k}$ is the Fourier frequency coordinates. The field of an incident plane wave can be written as follows.

$$\vec{E}_{inc}(\vec{x},s) = \vec{E}_s e^{i\vec{k}_s\cdot\vec{x}} \quad (5)$$

From Eqs. (1-4), the diffracted field is then $$\vec{E}_{dif}(\vec{x},s) = \Sigma_{\vec{k}} \vec{\vec{M}}(\vec{k},s) \cdot \vec{E}_s e^{i(\vec{k}+\vec{k}_s)\cdot\vec{x}} \quad (6a)$$

The intensity of the diffracted field is then given by $$I_{dif}(\vec{x},s) = |\vec{E}_{dif}(\vec{x},s)|^2 \quad (6b)$$

Eq. (6a) shows that the diffracted field is a coherent sum of plane waves, and each Fourier component of the mask function M is associated with a plane wave having propagation angle corresponding to $k+k_s$. The mask functions are generally incident angle dependent. That is, the rigorous formulation of mask function M varies as a function of s. This effect typically must be captured in advanced lithography simulations to accurately predict the behavior of printed patterns (e.g., pattern-dependent best focus variations, thru-focus behaviors of critical dimensions and pattern shifts). Although this effect can be rigorously taken into account by the Abbe imaging model as described above by Eqs. (1)-(6), this rigorous approach computes a sum over individual plane waves, which is computationally expensive.

For full-chip and other similar applications, the Hopkins imaging model is preferred for its fast speed. However, the incident angle dependency makes it difficult to use the rigorous mask function M with a Hopkins model for the subsequent image simulation at the wafer plane because the Hopkins model requires that the mask function be independent of the incident angle.

In the embodiments disclosed herein, an approach based on a new mask function $\overline{M}$ is disclosed. This approach meets the requirement of the Hopkins model (i.e., independent of the incident angle) and at the same time incorporates the incident angle effects of a given partially coherent illumination. The new mask function $\overline{M}$ is referred to as a partially coherent mask function (PCMF). In some of the embodiments disclosed herein, methods are disclosed to compute different types of PCMFs.

In the embodiments disclosed herein, the incident angle effects of individual source points of a given partially coherent illumination are removed from the mask function $\overline{M}$ and incorporated into a source function G. The source function G is the same for different mask layouts and accounts for the partial coherence of the source. It integrates the effects of individual planes waves in the illumination. The partially coherent mask function $\overline{M}$ is a function of the mask layout. However, it is also specific for the illumination. As a result, use of the partially coherent mask function $\overline{M}$ does not require an integration over individual plane waves in the illumination, as would be the case with rigorous mask function M. Therefore, the Hopkins model can be used with partially coherent mask function $\overline{M}$ and at the same time capture the incident angle effects.

As one example, the partially coherent mask function $\overline{M}$ has elements $\overline{M1}_{xx}$, $\overline{M1}_{xy}$, $\overline{M1}_{yx}$, $\overline{M1}_{yy}$, which may be defined implicitly as follows.

$$\overline{M1}^*_{\gamma\alpha}(\vec{k}_1)\overline{M1}_{\gamma\beta}(\vec{k}_2)G_{\alpha,\beta}(\vec{k}_1,\vec{k}_2)=H_{\alpha,\beta,\gamma}(\vec{k}_1,\vec{k}_2) \quad (7a)$$

$$G_{\alpha,\beta}(\vec{k}_1,\vec{k}_2)=\Sigma_s Q(\vec{k}_1,\vec{k}_2,\vec{k}_s)E^*_{s,\alpha}E_{s,\beta} \quad (7b)$$

$$H_{\alpha,\beta,\gamma}(\vec{k}_1,\vec{k}_2)=\Sigma_s M^*_{\gamma\alpha}(\vec{k}_1,s)M_{\gamma\beta}(\vec{k}_2,s)Q(\vec{k}_1,\vec{k}_2,\vec{k}_s)E^*_{s,\alpha}E_{s,\beta} \quad (7c)$$

M on the right-hand side of Eq. (7c) is the rigorous mask function defined above based on the rigorous Abbe imaging model. E is the incident plane wave polarization from the illumination. k represents the Fourier frequency of the related property. The superscript * indicates complex conjugate of the property. The subscripts α, β, γ denote x or y polarization. The summation $\Sigma_s$ is over individual incident plane waves.

Substituting Eq. (7b) for $G_{\alpha,\beta}$ in Eq. (7a) and substituting Eq. (7c) for $H_{\alpha,\beta,\gamma}$ in Eq. (7a) yields the following: for mask primitives $$\overline{M1}^*_{\gamma\alpha}(\vec{k}_1)\overline{M1}_{\gamma\beta}(\vec{k}_2)\Sigma_s Q(\vec{k}_1,\vec{k}_2,\vec{k}_s)E^*_{s,\alpha}E_{s,\beta}=\Sigma_s M^*_{\gamma\alpha}(\vec{k}_1,s)M_{\gamma\beta}(\vec{k}_2,s)Q(\vec{k}_1,\vec{k}_2,\vec{k}_s)E^*_{s,\alpha}E_{s,\beta} \quad (7d)$$

The right-hand side of Eq. (7d) is an expression for $H_{\alpha,\beta,\gamma}(\vec{k}_1,\vec{k}_2)$ using the rigorous Abbe imaging model. It is based on a sum over individual plane waves, where the rigorous mask function M is inside the summation. In comparison, the left-hand side of Eq. (7d) is an expression for $H_{\alpha,\beta,\gamma}(\vec{k}_1,\vec{k}_2)$ using the partially coherent mask function $\overline{M1}$, where the mask function $\overline{M1}$ is pulled outside the sum. This makes the mask function $\overline{M1}$ independent of the individual plane waves. The sum over the individual plane waves is contained within $G_{\alpha,\beta}(\vec{k}_1,\vec{k}_2)$. For convenience, G may be referred to as the source function because it captures the partial coherence characteristics of a given illumination source.

Figure 3:
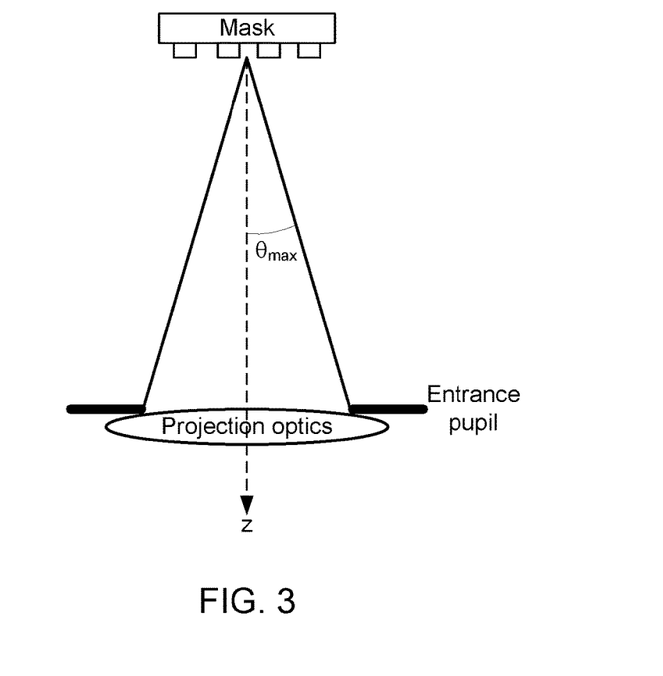
FIG. 3 illustrates the truncation of Fourier frequencies in a diffracted field by the entrance pupil of projection optics.

Q is a function to truncate or filter the Fourier frequency k depending on whether the corresponding diffracted plane wave can pass through the entrance pupil of the projection optics downstream of the mask. In one formulation, Q is set to zero for diffraction waves that cannot pass through the entrance pupil, as shown in Eq. (8a) and illustrated in FIG. 3. It may be also used as a weighting factor to emphasize certain Fourier components that can pass the pupil.

$$Q(\vec{k}_1,\vec{k}_2,\vec{k}_s)=0 \text{ if } |\vec{k}_1+\vec{k}_s|>k_{max} \text{ or } |\vec{k}_2+\vec{k}_s|>k_{max} \quad (8a)$$

$$Q(\vec{k}_1,\vec{k}_2,\vec{k}_s)>0 \text{ if } |\vec{k}_1+\vec{k}_s|<k_{max} \text{ or } |\vec{k}_2+\vec{k}_s|<k_{max} \quad (8a)$$

Here, $k_{max}=2\pi/\lambda \sin(\theta_{max})$, where $\lambda$ is the wavelength. In one simple formulation, $Q(\vec{k}_1,\vec{k}_2,\vec{k}_s)=1$ in the bottom Eq. (8b). In a different approach, Q is set according to the modulation transfer function or the amount of vignetting for each spatial frequency.

The PCMF defined above takes the form of a general tensor:

$$\overline{M} = \begin{bmatrix} \overline{M1}_{xx} & \overline{M1}_{xy} \\ \overline{M1}_{yx} & \overline{M1}_{yy} \end{bmatrix} \quad (9)$$

where the subscripts x,y represent different polarizations. This partially coherent mask function $\overline{M}$ allows for differences in x and y polarizations and also allows for cross-polarization effects between x and y polarizations.

Two other examples of PCMF definitions can be used to gain additional speed advantages. One is referred to as a diagonal form and the other as a scalar form. They offer additional speed advantages, as fewer elements need to be computed.

The diagonal form is defined as follows. This form absorbs the previous off-diagonal elements into the diagonal components:

$$\overline{M} = \begin{bmatrix} \overline{M2}_{xx} & 0 \\ 0 & \overline{M2}_{yy} \end{bmatrix} \quad (10)$$

where $$\overline{M2}^*_{\gamma\gamma}(\vec{k}_1)\overline{M2}_{\gamma\gamma}(\vec{k}_2)G_\gamma(\vec{k}_1,\vec{k}_2)=H_\gamma(\vec{k}_1,\vec{k}_2) \quad (11a)$$

$$G_\gamma(\vec{k}_1,\vec{k}_2)=\Sigma_s Q(\vec{k}_1,\vec{k}_2,\vec{k}_s)E^*_{s,\gamma}E_{s,\gamma} \quad (11b)$$

$$H_\gamma(\vec{k}_1,\vec{k}_2)=\Sigma_{\alpha,\beta,s} M^*_{\gamma\alpha}(\vec{k}_1,s)M_{\gamma\beta}(\vec{k}_2,s)Q(\vec{k}_1,\vec{k}_2,\vec{k}_s)E^*_{s,\alpha}E_{s,\beta} \quad (11c)$$

In this form, the summation $\Sigma_{\alpha,\beta,s}$ in Eq. (11c) is over individual incident plane waves and also over polarizations α, β. The cross-polarization effects between x and y polarizations are absorbed into H and subsequently into $\overline{M}$ once it is solved from Eq. (11a). As a result, the partially coherent mask function $\overline{M}$ does not allow for cross-polarization effects between x and y polarizations, as can be seen from the off-diagonal elements being 0. However, the partially coherent mask function $\overline{M}$ does allow for differences in x and y polarizations, as indicated by the different diagonal elements.

The scalar form further combines the diagonal elements into identical ones, by combining x- and y-polarizations:

$$\overline{M} = \overline{M3}\begin{bmatrix} 1 & 0 \\ 0 & 1 \end{bmatrix} \quad (12)$$

where $$\overline{M3}^*(\vec{k}_1)\overline{M3}(\vec{k}_2)G(\vec{k}_1,\vec{k}_2)=H(\vec{k}_1,\vec{k}_2) \quad (13a)$$

$$G(\vec{k}_1,\vec{k}_2)=\Sigma_{\gamma,s}Q(\vec{k}_1,\vec{k}_2,\vec{k}_s)E^*_{s,\gamma}E_{s,\gamma} \quad (13b)$$

$$H(\vec{k}_1,\vec{k}_2)=\Sigma_{\gamma,\alpha,\beta,s}M^*_{\gamma\alpha}(\vec{k}_1,s)M_{\gamma\beta}(\vec{k}_2,s)Q(\vec{k}_1,\vec{k}_2,\vec{k}_s)E^*_{s,\alpha}E_{s,\beta} \quad (13c)$$

In this form, the summation $\Sigma_{\gamma,\alpha,\beta,s}$ is over individual incident plane waves and polarizations $\gamma$, $\alpha$, $\beta$. The source function G combines the x- and y-polarization effects as shown in Eq. (13b). Accordingly, the partially coherent mask function $\overline{M}$ does not allow for differences in x and y polarizations or for cross-polarization effects between x and y polarizations.

Note that the implicit relationships between the PCMF $\overline{M}$ and other physical properties in the above equations are not derived rigorously from first-principle natural physics equations that govern imaging processes. They are engineered or designed relationships with the assumption that if an $\overline{M}$ can be found that satisfies these relationships, it can be used to replace the angle-dependent rigorous mask functions in the subsequent image simulations to accurately predict printed images.

To obtain the explicit representation of the PCMF $\overline{M}$, the equations of the implicit definition are solved. In general, only an approximate solution exists. In one approach, the Eq. (7a) can be solved for $\overline{M}$ as an optimization problem that minimizes the following cost function F for the tensor form of the PCMF.

$$F(\overline{M1})=\Sigma_{k_1,k_2,\alpha,\beta,\gamma}|\overline{M1}^*_{\gamma\alpha}(\vec{k}_1)\overline{M1}_{\gamma\beta}(\vec{k}_2)G_{\alpha,\beta}(\vec{k}_1,\vec{k}_2)-H_{\alpha,\beta,\gamma}(\vec{k}_1,\vec{k}_2)|^2 \quad (14)$$

Similarly, the following cost function may be used to solve for the diagonal form of the PCMF Eq. (11a)

$$F(\overline{M2})=\Sigma_{k_1,k_2,\gamma}|\overline{M2}^*_{\gamma\gamma}(\vec{k}_1)\overline{M2}_{\gamma\gamma}(\vec{k}_2)G_\gamma(\vec{k}_1,\vec{k}_2)-H_\gamma(\vec{k}_1,\vec{k}_2)|^2 \quad (15)$$

and the following cost function may be used to solve for the scalar form of the PCMF Eq. (13a)

$$F(\overline{M3})=\Sigma_{k_1,k_2}|\overline{M3}^*(\vec{k}_1)\overline{M3}(\vec{k}_2)G(\vec{k}_1,\vec{k}_2)-H(\vec{k}_1,\vec{k}_2)|^2 \quad (16)$$

Figure 4A:
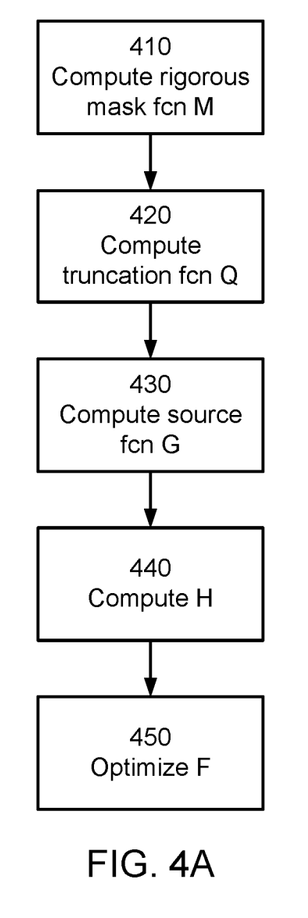
FIGS. 4A and 4B describe a process that computes a partially coherent mask function (PCMF).

FIG. 4A is a flow diagram of one process to solve the equations for the PCMF, as shown above. The following example is based on the tensor $\overline{M}$ of Eq. (9) but it may also be used for the diagonal and scalar formulations of Eqs. (10) and (12). Referring to Eqs. (7a)-(7c), the rigorous mask functions M and their Fourier transforms are computed 410 for all incident plane waves in a partially coherent source according to Eqs. (1)-(4). The truncation function Q is computed 420 according to Eqs. (8a)-(8b), and only those Fourier frequencies that can pass the entrance pupil for subsequent calculations are selected. The source function G is computed 430 by integrating the properties of interest over all incident angles as specified in Eq. (7b). The function H is computed 440 by integrating the properties of interest over all incident angles as specified in Eq. (7c). At this point, the functions G and H have been computed and the optimization problem of Eq. (14) may be solved 450 for the PCMF components $\overline{M1}$.

Figure 4B:
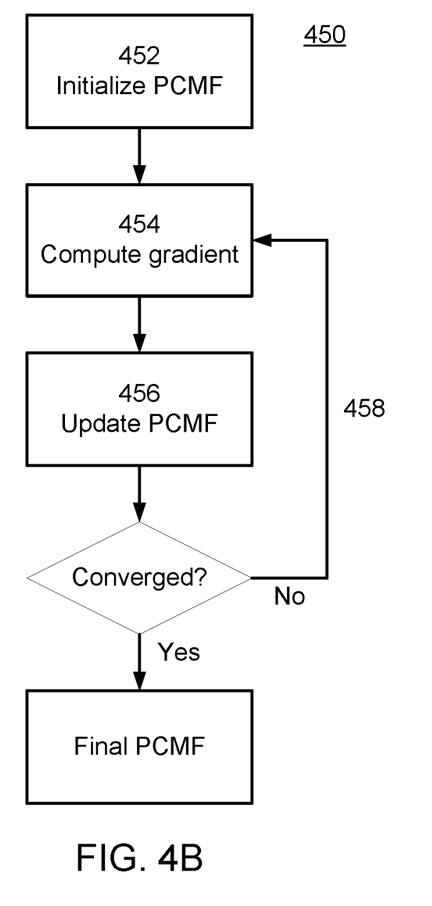

FIG. 4B is a flow diagram of one process for carrying out the last step 450 in the above flow chart. In FIG. 4B, a gradient descent method is used to iteratively solve the optimization problem. Other optimization methods may be used as well, such as methods based on Broyden-Fletcher-Goldfarb-Shanno (BFGS) algorithm and methods based on singular value decomposition (SVD) or principle component analysis (PCA).

The method of FIG. 4B begins with an initial guess 452 for the tensor $\overline{M}$. Examples include the rigorous mask function M evaluated at normal incidence, and a weighted average of the rigorous mask function M over different incident angles of the illumination. The gradient of the cost function F with respect to the complex conjugate of the PCMF is calculated 454. The current estimate of $\overline{M}$ is updated by taking 456 a step in the direction along the gradient. The step size may be adjusted using conventional techniques. This process repeats 458 until the PCMF $\overline{M}$ converges.

It has been shown in numerical experiments that the partially coherent mask function $\overline{M}$ is defined and solved in such a way that it is specific to an illumination and incorporates the integrated effects of incident angles of the illumination, but not dependent on individual plane waves in the illumination. This is self-evident based on the process where it has integration or summation over individual incident plane waves, as indicated by 's'. Therefore, the result no longer has the dependent variable 's'. As a result, the PCMF can be used with a Hopkins imaging model to capture the incident angle effects in lithography simulations.

The speed-up in computation allows for full-chip lithography simulation where use of the rigorous Abbe imaging model would be too slow. This may be used to predict the aerial image produced by the mask and/or to revise the mask layout based on the simulated effect.

In one approach, the PCMFs are calculated for different types of mask primitives, such as edges, corners, edge-edge pairs, corner-corner pairs, etc. The actual mask design is decomposed into these primitives, and the effect of the actual mask is then calculated based on the PCMFs of the corresponding primitives. To do this, the source PCMFs M for the mask primitives may be pre-calculated and stored in a lookup table. These pre-calculated values are then retrieved to calculate the effect of a particular mask design. Use of the Hopkins model also allows modeling of the mask independent of optics that are downstream of the mask.

Figure 5A:
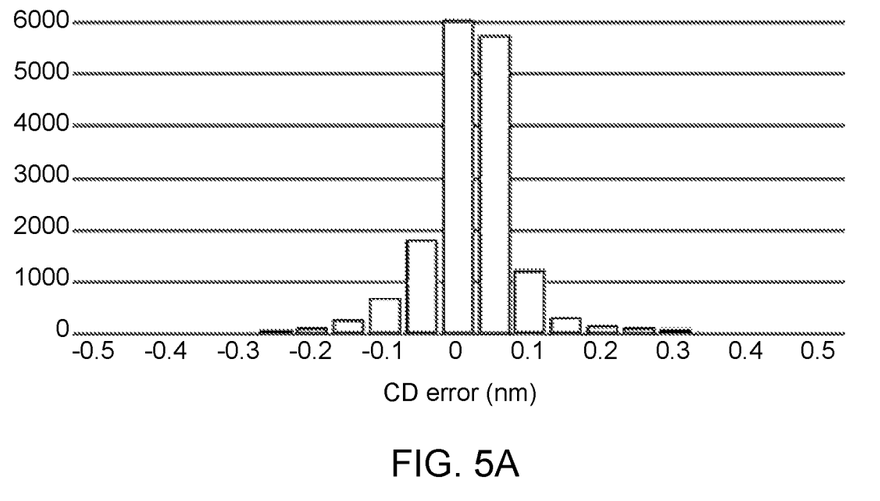
FIGS. 5A and 5B show histograms of critical dimension (CD) errors simulated using a PCMF compared to rigorous results in a deep UV (DUV) lithography application.
Figure 5B:
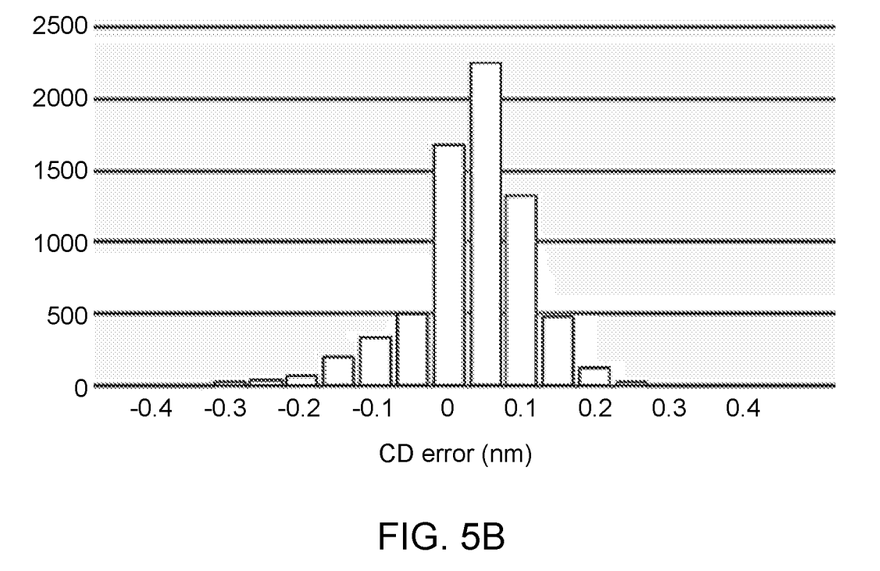

FIGS. 5A and 5B show the histograms of critical dimension (CD) errors using the PCMF approach compared to rigorous results in a DUV lithography application. This example uses the diagonal formulation of Eq. (10). In this numerical experiment, a 6% attenuated phase shift mask (PSM) was illuminated by a cross quadrupole illuminator. The printed contours of about 7,000 2D patterns and about 17,000 1D patterns were simulated. The critical dimensions (CD) of these contours were measured and compared between those computed using the PCMF approach and those computed using the incident angle-dependent rigorous mask function. FIG. 5A shows the histogram of CD errors for the 1D patterns and FIG. 5B shows the histogram of CD errors for the 2D patterns. The root mean squared errors are 0.07 nm for 1D patterns and 0.08 nm for 2D patterns, which are considered excellent for DUV lithography applications.

By design, a PCMF is also independent of downstream imaging settings (e.g., wafer defocus, wafer film stack, etc.), which allows the PCMF-based 3D mask model to be separable from the downstream imaging model. Model separability is a desirable feature in computational lithography applications.

Figure 6:
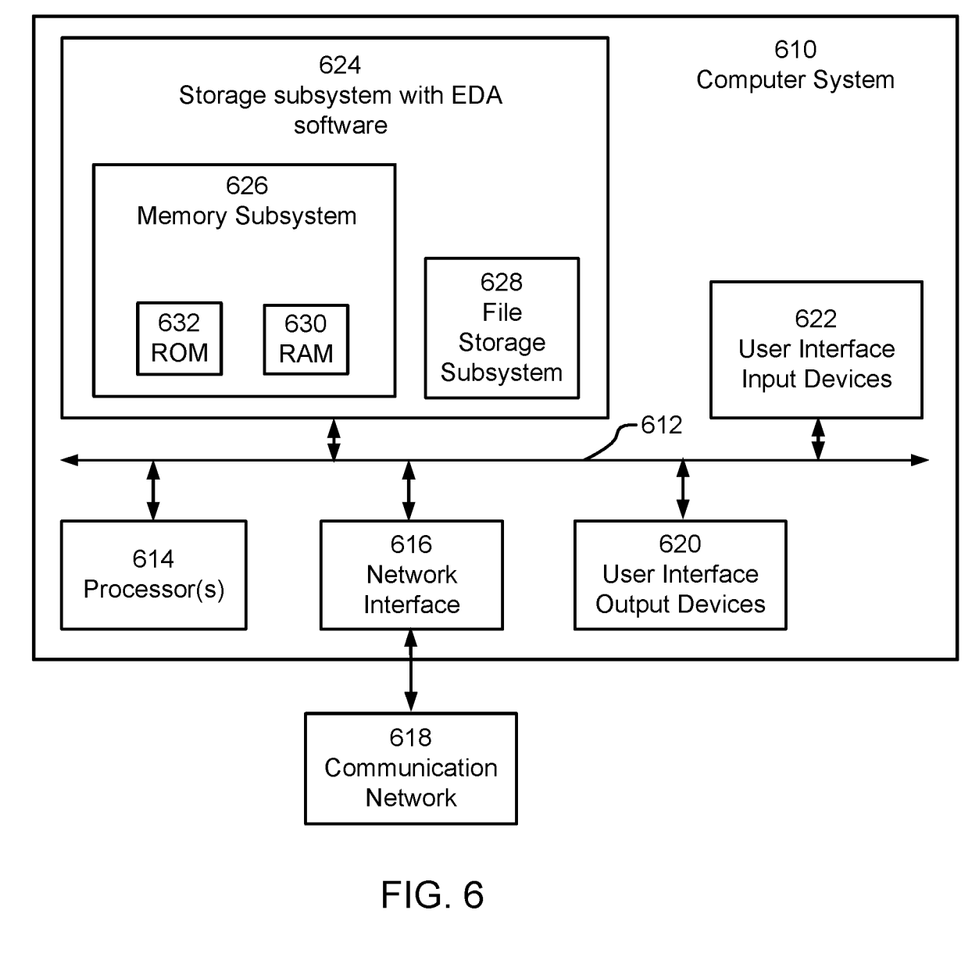
FIG. 6 is a block diagram of one embodiment of a computer system that may be used with the present invention.

FIG. 6 is a block diagram of one embodiment of a computer system 610 that may be used with the present invention. The computer system 610 typically includes at least one computer or processor 614 which communicates with a number of peripheral devices via bus subsystem 612. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms "processor" and "computer" are further defined below. These peripheral devices may include a storage subsystem 624, comprising a memory subsystem 626 and a file storage subsystem 628, user interface input devices 622, user interface output devices 620, and a network interface subsystem 616. The input and output devices allow user interaction with computer system 610.

The computer system may be a server computer, a client computer, a workstation, a mainframe, a personal computer (PC), a tablet PC, a rack-mounted "blade" or any data processing machine capable of executing instructions (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term "processor" here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the operations discussed herein. Due to the ever-changing nature of computers and networks, the description of computer system 610 depicted in FIG. 6 is intended only as one example for purposes of illustrating the preferred embodiments. Many other configurations of computer system 610 are possible having more or less components than the computer system depicted in FIG. 6.

Network interface subsystem 616 provides an interface to outside networks, including an interface to communication network 618, and is coupled via communication network 618 to corresponding interface devices in other computer systems or machines. Communication network 618 may comprise many interconnected computer systems, machines and communication links. These communication links may be wireline links, optical links, wireless links, or any other devices for communication of information. Communication network 618 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 622 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 610 or onto communication network 618. User interface input devices typically allow a user to select objects, icons, text and the like that appear on some types of user interface output devices, for example, a display subsystem.

User interface output devices 620 may include a display subsystem, a printer, or non-visual displays such as audio output devices. The display subsystem may include a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 610 to the user or to another machine or computer system.

Memory subsystem 626 typically includes a number of memories including a main random-access memory (RAM) 630 (or other volatile storage device) for storage of instructions and data during program execution and a read only memory (ROM) 632 in which fixed instructions are stored. File storage subsystem 628 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 628.

Bus subsystem 612 provides a device for letting the various components and subsystems of computer system 610 communicate with each other as intended. Although bus subsystem 612 is shown schematically as a single bus, alternative embodiments of the bus subsystem may use multiple busses. For example, RAM-based main memory can communicate directly with file storage systems using Direct Memory Access (DMA) systems.

As used herein, the term "module" signifies a tangible data and information processing device, that typically is limited in size and/or complexity. For example, the term "module" can signify one or more methods or procedures that can transform data and information. The term "module" can also signify a combination of one or more methods and procedures in a computer program. The term "module" can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as "operations") applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term "algorithm" signifies a process comprising a sequence or set of operations or instructions that a module can use to transform data and information to achieve a result. A module can comprise one or more algorithms. As used herein, the term "thread" refers to a sequence of instructions that can comprise a subset of the instructions of an entire process or algorithm. A process or algorithm can be partitioned into multiple threads that can be executed in parallel.

As used herein, the term "computer" includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term "software" or "program" signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term "programming language" signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A method implemented on a computer system, the computer system executing instructions to effect the method for approximating the effect of a lithographic mask on illumination produced by a partially coherent source, the method comprising:
   pre-calculating a source function G that is the same for different mask layouts and accounts for partial coherence of the illumination, wherein the source function G integrates effects of individual planes waves in the illumination;
   representing the mask layout using a partially coherent mask function $\overline{M}$ that is specific for the illumination and calculated as a function of the source function G; and
   using the partially coherent mask function $\overline{M}$ to calculate the effect of the mask on the illumination, wherein the calculation using the partially coherent mask function $\overline{M}$ does not integrate over individual plane waves in the illumination.

2. The computer-implemented method of claim 1 further comprising:
   revising the mask layout based on the calculated effect of the mask on the illumination; and
   using the revised mask layout in a process to design and manufacture the lithographic mask.

3. The computer-implemented method of claim 1 wherein the partially coherent mask function $\overline{M}$ is used to calculate a full-chip lithography simulation.

4. The computer-implemented method of claim 1 further comprising:
   calculating partially coherent mask functions $\overline{M}$ for different types of mask primitives;
   wherein representing the mask layout comprises decomposing the mask layout into the mask primitives; and calculating the effect of the mask on the illumination comprises, based on the decomposition, using the partially coherent mask functions $\overline{M}$ for the mask primitives to calculate the effect of the mask on the illumination.

5. The computer-implemented method of claim 4 further comprising:
   storing the partially coherent mask functions $\overline{M}$ for the different types of mask primitives in a lookup table, wherein calculating the effect of the mask comprises retrieving the stored partially coherent mask functions $\overline{M}$ from the lookup table.

6. The computer-implemented method of claim 4 wherein partially coherent mask functions $\overline{M}$ are calculated for mask primitives that include edges, corners, edge-edge pairs, and corner-corner pairs.

7. The computer-implemented method of claim 1 further comprising:
   based on the calculated effect of the mask on the illumination, predicting an aerial image produced by the mask.

8. The computer-implemented method of claim 1 wherein the source function G also include spatial frequency filter effects of an entrance pupil for projection optics that are downstream of the mask.

9. The computer-implemented method of claim 1 wherein the partially coherent mask function $\overline{M}$ is independent of projection optics that are downstream of the mask.

10. The computer-implemented method of claim 1 wherein a rigorous imaging model is based on a sum of terms that include a rigorous mask function M and the sum is over individual plane waves; and the partially coherent mask function $\overline{M}$ approximates the rigorous imaging model by pulling the mask function M outside the sum.

11. The computer-implemented method of claim 1 wherein the partially coherent mask function $\overline{M}$ take the tensor form $$\begin{bmatrix} \overline{M1}_{xx} & \overline{M1}_{xy} \\ \overline{M1}_{yx} & \overline{M1}_{yy} \end{bmatrix}$$

where the subscripts x,y represent different polarizations.

12. The computer-implemented method of claim 11 wherein the components $\overline{M1}$ of the partially coherent mask function $\overline{M}$ are defined by $$\overline{M1}^*_{\gamma\alpha}(\vec{k}_1)\overline{M1}_{\gamma\beta}(\vec{k}_2)G_{\alpha,\beta}(\vec{k}_1,\vec{k}_2)=H_{\alpha,\beta,\gamma}(\vec{k}_1,\vec{k}_2)$$

$$G_{\alpha,\beta}(\vec{k}_1,\vec{k}_2)=\Sigma_s Q(\vec{k}_1,\vec{k}_2,\vec{k}_s)E^*_{s,\alpha}E_{s,\beta}$$

$$H_{\alpha,\beta,\gamma}(\vec{k}_1,\vec{k}_2)=\Sigma_s M^*_{\gamma\alpha}(\vec{k}_1,s)M_{\gamma\beta}(\vec{k}_2,s)Q(\vec{k}_1,\vec{k}_2,\vec{k}_s)E^*_{s,\alpha}E_{s,\beta}$$

where M is a rigorous mask function based on a rigorous imaging model; E is an incident plane wave polarization from the illumination; k represents a Fourier frequency; superscript * indicates complex conjugate; subscripts α, β, γ denote x or y polarization; the summation $\Sigma_s$ is over individual incident plane waves; and Q represents spatial frequency filter effects of an entrance pupil for projection optics that is downstream of the mask.

13. The computer-implemented method of claim 1 wherein the partially coherent mask function $\overline{M}$ allows for differences in x and y polarizations and also allows for cross-polarization effects between x and y polarizations.

14. The computer-implemented method of claim 1 wherein the partially coherent mask function $\overline{M}$ take the tensor form $$\begin{bmatrix} \overline{M2}_{xx} & 0 \\ 0 & \overline{M2}_{yy} \end{bmatrix}$$

where the subscripts x,y represent different polarizations.

15. The computer-implemented method of claim 14 wherein the components $\overline{M2}$ of the partially coherent mask function $\overline{M}$ are defined by $$\overline{M2}^*_{\gamma\gamma}(\vec{k}_1)\overline{M2}_{\gamma\gamma}(\vec{k}_2)G_\gamma(\vec{k}_1,\vec{k}_2)=H_\gamma(\vec{k}_1,\vec{k}_2)$$

$$G_\gamma(\vec{k}_1,\vec{k}_2)=\Sigma_s Q(\vec{k}_1,\vec{k}_2,\vec{k}_s)E^*_{s,\gamma}E_{s,\gamma}$$

$$H_\gamma(\vec{k}_1,\vec{k}_2)=\Sigma_{\alpha,\beta,s} M^*_{\gamma\alpha}(\vec{k}_1,s)M_{\gamma\beta}(\vec{k}_2,s)Q(\vec{k}_1,\vec{k}_2,\vec{k}_s)E^*_{s,\alpha}E_{s,\beta}$$

where M is a rigorous mask function based on a rigorous imaging model; E is an incident plane wave polarization from the illumination; k represents a Fourier frequency; superscript * indicates complex conjugate; subscripts α, β, γ denote x or y polarization; the summation $\Sigma_{\alpha,\beta,s}$ is over individual incident plane waves and polarizations α, β; and Q represents spatial frequency filter effects of an entrance pupil for projection optics that is downstream of the mask.

16. The computer-implemented method of claim 1 wherein the partially coherent mask function $\overline{M}$ does not allow for cross-polarization effects between x and y polarizations but does allow for differences in x and y polarizations.

17. The computer-implemented method of claim 1 wherein the partially coherent mask function $\overline{M}$ take the tensor form $$\overline{M3}\begin{bmatrix} 1 & 0 \\ 0 & 1 \end{bmatrix}.$$

18. The computer-implemented method of claim 17 wherein the component $\overline{M3}$ of the partially coherent mask function $\overline{M}$ is defined by $$\overline{M3}^*(\vec{k}_1)\overline{M3}(\vec{k}_2)G(\vec{k}_1,\vec{k}_2)=H(\vec{k}_1,\vec{k}_2)$$

$$G(\vec{k}_1,\vec{k}_2)=\Sigma_{\gamma,s} Q(\vec{k}_1,\vec{k}_2,\vec{k}_s)E^*_{s,\gamma}E_{s,\gamma}$$

$$H(\vec{k}_1,\vec{k}_2)=\Sigma_{\gamma,\alpha,\beta,s}M^*_{\gamma\alpha}(\vec{k}_1,s)M_{\gamma\beta}(\vec{k}_2,s)Q(\vec{k}_1,\vec{k}_2,\vec{k}_s)E^*_{s,\alpha}E_{s,\beta}$$

where M is a rigorous mask function based on a rigorous imaging model; E is an incident plane wave polarization from the illumination; k represents a Fourier frequency; superscript * indicates complex conjugate; subscripts $\alpha$, $\beta$, $\gamma$ denote x or y polarization; the summation $\Sigma_{\gamma,\alpha,\beta,s}$ is over individual incident plane waves and polarizations $\alpha$, $\beta$, $\gamma$; and Q represents spatial frequency filter effects of an entrance pupil for projection optics that is downstream of the mask.

19. The computer-implemented method of claim 1 wherein the partially coherent mask function $\overline{M}$ does not allow for differences in x and y polarizations or for cross-polarization effects between x and y polarizations.

20. An EDA tool for approximating the effect of a lithographic mask on illumination produced by a partially coherent source, comprising:
   a data store that stores a design for the lithographic mask, and that further stores pre-calculated partially coherent mask functions $\overline{M}$ for different types of mask primitives; wherein the partially coherent mask functions $\overline{M}$ are specific for the illumination and calculated as a function of a source function G, and the source function G is the same for different mask primitives and accounts for partial coherence of the illumination and integrates effects of individual planes waves in the illumination;
   a computer system in communication with the data store, the computer system configured to:
      decompose the mask layout into the mask primitives; and
      based on the decomposition, use pre-calculated partially coherent mask functions $\overline{M}$ for the mask primitives to calculate the effect of the mask on the illumination, wherein the calculations using the partially coherent mask functions $\overline{M}$ does not integrate over individual plane waves in the illumination.

* * * * *